(12) United States Patent
Piwczyk

(10) Patent No.: US 8,236,677 B2
(45) Date of Patent: Aug. 7, 2012

(54) RTA FOR FABRICATION OF SOLAR CELLS

(75) Inventor: Bernhard P. Piwczyk, Dunbarton, NH (US)

(73) Assignee: IPG Photonics Corporation, Oxford, MA (US)

( * ) Notice: Subject to any disclaimer, the term of this patent is extended or adjusted under 35 U.S.C. 154(b) by 0 days.

(21) Appl. No.: 13/024,866

(22) Filed: Feb. 10, 2011

(65) Prior Publication Data

US 2011/0183457 A1 Jul. 28, 2011

Related U.S. Application Data

(63) Continuation of application No. 12/552,306, filed on Sep. 2, 2009, now Pat. No. 7,915,154.

(60) Provisional application No. 61/093,890, filed on Sep. 3, 2008.

(51) Int. Cl.
*H01L 21/22* (2006.01)
*H01L 21/26* (2006.01)

(52) U.S. Cl. ........................................ 438/557; 438/795

(58) Field of Classification Search ....................... None
See application file for complete search history.

(56) References Cited

U.S. PATENT DOCUMENTS

| 5,488,012 | A | * | 1/1996 | McCarthy | ..................... 438/479 |
| 7,915,154 | B2 | * | 3/2011 | Piwczyk | ........................ 438/557 |
| 2006/0151449 | A1 | * | 7/2006 | Warner et al. | ............. 219/121.65 |

* cited by examiner

*Primary Examiner* — Scott B Geyer

(57) ABSTRACT

A method of semiconductor junction formation in RTA process for fabrication of solar cells provides for delivery of inert gases in the vicinity of the Si wafer while dopant species are being driven form a dopant source into the surface of the wafer irradiated by a laser beam. The laser beam is emitted by CW- or pulsed operated lasers including fiber lasers operative to provide annealing and diffusion operation. Optionally, the passivation of the surface and formation of the antireflection coating are performed simultaneously with the penetration the dopant species.

19 Claims, 4 Drawing Sheets

RTA FOR FABRICATION OF SOLAR CELLS

RELATED APPLICATIONS

This application is a continuation of U.S. patent application Ser. No. 12/552,306, filed Sep. 2, 2009 now U.S. Pat. No. 7,915,154 fully incorporated herein by reference and based, in turn on a provisional application 61/093,890 filed on Sep. 3, 2008.

BACKGROUND OF THE DISCLOSURE

1. Field of the Invention

The present invention relates to a composition of a solid or liquid coating as an impurity dopant source, and a laser-assisted diffusion of the composition leading to a time- and cost-effective fabrication method of solar cells.

2. Description of the Related Prior Art

The formation of the cell junction in the process of manufacturing silicon solar cells is realized, in part, by the diffusion of different types of impurities or dopants into single crystal and multi- or poly-crystalline silicon wafers. This is achieved by depositing a compound containing the desired dopants onto the cell surface, followed by heating at high temperatures to allow silicon wafers to anneal so that dopant atoms penetrate into the cell surface by thermal treatment.

The effectiveness of the solar cell fabrication based on the above-disclosed traditional thermal diffusion, thus, depends on the duration of the diffusion step and the number and/or size of furnaces providing for simultaneous thermal treatment of multiple wafers. The overall time associated with traditional fabrication methods may be on the order of tens of minutes, which is long for high output production. Furthermore, the simultaneous thermal treatment of a plurality of coated wafers, which is necessary for the efficient cell manufacturing, requires multiple, large diffusion furnaces are costly.

One of the latest trends in the solar cell fabrication includes depositing of dopants by means of laser radiation which is typically generated by pulsed lasers. In general, there are two laser-assisted diffusion techniques: the laser-induced melting of predeposited impurity doping (LIMPID) (See *The Dopant Diffusion Mechanism in Excimer Laser Induced Molten Silicon*, Toshiyuki et al, Symposium Proceedings of the Materials Research Society, Vol. 101, pp. 491-494—fully incorporated herein by reference.)

The LIMPID technique is associated with a solid layer as a dopant source which is typically deposited by chemical vapor deposition (CVD) or sputtering. Once the deposition of the solid layer is completed, the laser diffusion is performed by exposing the coated wafer to laser radiation. This technique is typically associated with a wafer enclosed in a vacuum chamber to prevent oxidation of the molten Si surface, which is undesirable. The cost of the chambers and vacuum systems may render the discussed technique coast-ineffective.

The gaseous induced laser diffusion (GILD) technique is associated with the uncoated wafer enclosed in a vacuum chamber which contains the dopant gas at reduced pressure minimizing the oxidation of the wafer's surface during subsequent laser irradiation. (See U.S. Pat. No. 5,323,013) The laser radiation enters the chamber through a window to diffuse the dopant from gas phase into the annealed wafer surface forming the semiconductor junction. This technique, like the above discussed LIMPID, may be lengthy for modern mass production methods because many of the methods steps are performed sequentially.

A need, therefore, exists for a cost-effective mass-production fabrication process of semiconductor junctions utilizing Rapid Thermal Annealing (RTA) by laser radiation in the presence of anti-oxidation gases for depositing a suitably uniform coating within about one second or less at an ambient pressure.

A further need exists for an apparatus operative to realize the disclosed method.

SUMMARY OF THE INVENTION

The disclosed laser diffusion process, satisfying this need, is capable of high throughput manufacturing of solar cells each having a shallow uniform junction depth. Moreover, as compared to the known fabrication process, the disclosed method may provide for a suitably uniform coating within about one second or less.

In accordance with one aspect of the disclosure, the desired species of dopants are diffused into a Si wafer in the environment preventing the oxidation of the molten Si surface. In particular, the presence of inert gases during the laser diffusion step accelerates the fabrications process.

In accordance with a further aspect, preferably, the deposition of the dopant and passivation atoms is performed simultaneously. The simultaneous introduction of dopant and passivation atoms accelerates the annealing, which, even without the passivation step as disclosed here, lasts no more than a few seconds.

In a further aspect of the disclosure, since the coating, i.e., the source of dopants is configured as a thin film transparent to the laser radiation, the radiated output laser beam may be conditioned to totally internally reflect within the film. Accordingly, such a reflection considerably improves thermal conditions and leads to the reduction on the required laser power.

BRIEF DESCRIPTION OF THE DRAWINGS

The disclosed and other features, aspects, and advantages of the present disclosure will become more readily apparent in conjunction with the following drawings, in which.

SPECIFIC DESCRIPTION

Figure 1:
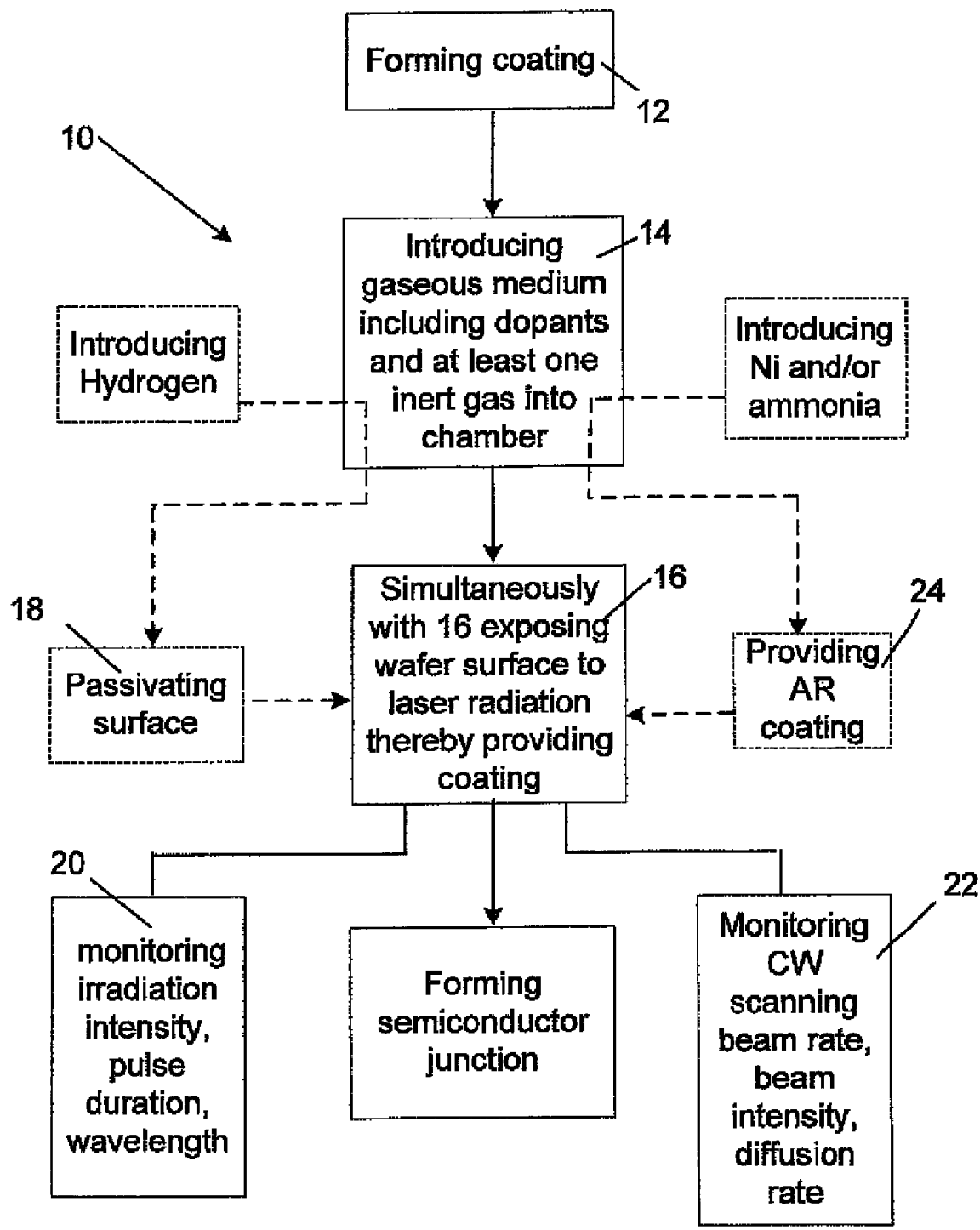
FIG. 1 illustrates one of the embodiments of the disclosed method.

Reference will now be made in detail to the disclosed method and system. Wherever possible, same or similar reference numerals are used in the drawings and the description to refer to the same or like parts or steps. The drawings are in simplified form and are far from precise scale.

FIG. 1 illustrates one embodiment of disclosed RTA process 10 utilizing laser radiation process 10. Any thermal treatment of the wafer results in annealing and diffusion. Annealing is a thermal process whereby dopant atoms already located within the wafer, are relocated from intestitial sites to stitial sites within the crystal letters which leads to the very shallow junction formed within a molten region of wafer but being shallower than the molten region. Diffusion essentially is a stage of the RTA at which all dopant atoms are located at stitial sites. This, the annealing and diffusion stages of the RTA although may have a sub-stage in common, i.e., the annealing stage includes diffusion and vice versa. Accordingly, the term RTA process as referred to hereinbelow includes a stage selected from the group consisting of diffusing and annealing and a combination of these. g of the stage The formation of the semiconductor junction begins with a step 12 providing for the formation of a solid coating or film atop a Si wafer in such a way that the coating itself is configured as a source of dopants. The formation of the coating may be implemented by alternative techniques suitable for the given manufacturing conditions. For example, a thin coating containing a compound, which includes dopant species, may be sprayed upon the top of the wafer. A variety of potential compounds such as the ACCUSPIN© series of phosphorus dopants are readily available as a spray-on dopant for solar cells. (See U.S. Pat. No. 5,527,389 fully incorporated herein by reference) Alternatively, the coating may be provided by dipping a wafer into a liquid containing the desired dopants. The liquid source for the coating may include a solution of compound including, for example, phosphorous, arsenic, antimony, or boron. A further alternative technique may include a vapor deposition technique. Regardless of the selected technique, any compound containing, for example, phosphorus, hydrogen, carbon, and oxygen may be used for forming the solid coating layer configured as a dopant source. Given only as an example, the compound may be selected from Di-n-butylphosphite, or Di-n-amylphosphate.

The desired dopant species may be incorporated in a solution containing any of a number of possible solvents. This can be realized by mixing a doping chemical compound mixed with a high volatility solvent, such as propanol prior to coating. The high volatility solvent enables rapid film deposition and drying at a rate compatible with the processing rate of wafers. Furthermore, the IR radiation may be used to enhance the evaporation rate of the solvent during the coating step. When the solvent is evaporated in the air or gas at atmospheric pressure, with or without the application of IR radiation, a thin layer of the dopant chemicals—film—in liquid or solid form is left on the wafer surface. Following the formation of the film is a step 14 during which the coated wafer is inserted into a chamber for laser treatment.

Silicon is highly reactive with oxygen, particularly in its molten state which creates favorable conditions for the formation of silicon dioxide ($SiO_2$) on top of the surface during the laser irradiation step. The oxide layer is undesirable and the formation thereof in a traditionally used laser deposition method can be substantially prevented by creating a vacuum or near-vacuum environment. Hence the known LIMPID technique, typically, includes creating a vacuum within the chamber before the exposure of the wafer to the beam.

In contrast to the known technique, disclosed process 10 allows for a laser beam to be incident upon the coated wafer at least at an ambient pressure. While the use of ambient gas at above atmospheric pressure is not excluded from the inventive scope, atmospheric pressure is preferred, since it does not require expensive vacuum systems or pumps. The mentioned pressures are the result of one of salient features of method 10 as represented by a step 16. In particular, this step includes the introduction of a carrier gaseous mixture, which contains one or more inert gases, into a vacuum chamber substantially simultaneously with the laser irradiation. Without any limitation, noble or inert ambient gases may include helium (He), argon (Ar) introduced along with, for example, hydrogen and nitrogen the importance of which is disclosed below.

As the coated wafer is subjected to intense laser radiation in step 16, the Si surface starts melting forcing a large portion of dopant atoms to diffuse from the film onto the melting surface. As one of ordinary skills readily realizes, the diffusion coefficient of dopant species in the ambient increases by about six orders of magnitude when compared to the diffusion coefficient from the ambient into the solid semiconductor as in thermal diffusion. This increase of the diffusion coefficient results in the much shorter diffusion time required for junction formation from tens of minutes to much less than a second.

The junction depth, which should be preferably uniform and shallow, depends on the melt depth of the top surface of molten Si material, which, in turn, is a result of laser beam radiation of the wafer and the speed of diffusion. In addition, as the laser irradiation of the film continues, some of solid- or liquid-state dopant atoms disposed in the film enter into the gas phase since the film rapidly volatilizes. The gaseous dopant atoms, however, dwell in the vicinity of the melting Si surface. As a consequence, dopants not only diffuse from the solid or liquid film, but also from the resulting gaseous ambient.

The melt depths and the speed at which the dopant diffuses into the molten silicon control the junction depth. If the melt depth is relatively large and the period during which the material remains molten is relatively short, the junction depth may not be as deep as the thickness of the molten layer on top of the silicon. If, however, the melt depth is relatively shallow, and the period during which the material on top of the wafer remains molten is sufficiently long, then junction depth will be the same as the melt depth. In the latter case, the junction can be very abrupt when compared to the impurity profile obtained by standard thermal treatment. In addition all dopant species are incorporated into the crystal lattice substitutionally or stitially even if the solid solubility limit is exceeded. This is due to the fact that the dopant species are incorporated into the lattice during the recrystallization of the molten silicon layer on top of the wafer. As a result, the dopant material in the lattice may be electronically active and can contribute to the photo-current generated in the solar cell by the sun light. Thus in accordance with the disclosed RTA dopant species can be either located stitially or interstitially in the crystal lattice.

If the pulsed laser configuration is used, the depth of the molten layer and the speed of the melt front is the function of the laser irradiation intensity, pulse duration and wavelength, as shown in step 20. A lower irradiation intensity, shorter pulse duration and shorter wavelength of the irradiating light result in a shallower absorption depth of the energy and a shallower melt depth. If the continuous wave (CW) laser configuration is employed and the laser beam is scanned, as disclosed below, the diffusion depth depends on the wavelength, beam scanning rate, beam intensity and diffusion rate of the given dopant species all monitored in step 22.

As to the laser configuration, i.e., CW or pulsed operating lasers, it should be noted that traditionally short pulse and short wavelength lasers such as excimer lasers have been used for laser treatment. Using the CW operated lasers or even $CO_2$ lasers, long wavelengths such as infrared can be advantageously utilized. This does not exclude short pulse or short wavelength lasers such as frequency doubled or tripled Nd:YAG lasers and Q-switched lasers. In addition, the use of fiber lasers is preferred due to the high wall plug efficiency and reliability thereof. Another possible light source includes laser diodes configured as a laser pump which operates at about 0.904 micron wavelength. In summary, the presently disclosed RTA process may be implemented by laser devices generating the output within a range from about 193 nm to about 10600 nm.

Electronic semiconductor junction formation is an essential part in the fabrication of PV cells or films in the RTA process. The light conversion efficiency of a solar cell is dependent on many different factors such as semiconductor material properties, impurities and the profile thereof in the material, electrical contact resistance, light surface reflectivity and semiconductor junction properties among others. Hence, either annealing or diffusing or both stags are the subject to easily controllable conditions.

The resulting impurity profile may depend on the dopant impurity concentration at the surface during the molten state of the Si surface layer. The impurity concentration, in turn, is a function of the dopant concentration in the predeposited surface layer and the evaporation or ablation rate of the deposited layer. If the deposited layer is volatilized by the high intensity radiation before the underlying Si layer is resolidified, the impurity concentration profile may be limited due to exhaustion of the predeposited dopant source surface layer. If the diffusion source is not exhausted before resolidification of the Si surface layer, an impurity concentration within the Si surface layer, which may exceed even the solid solubility limit, can be achieved without the formation of a precipitate of the dopant species.

An important additional factor to reckon with during the junction formation process is the presence of certain material defects that can shorten the carrier electron lifetime in the material during operation. This is particular relevant to solar cell manufacturing since the latter typically uses wafers of inferior quality. One important type of these defects is often referred to as a "dangling bond"; these defects are assumed to be unsatisfied atomic bonds that can capture electrons traveling through the bulk material after they have been generated at the device semiconductor junction and move toward the electrode to generate electrical current. The technique used to minimize these defects is known as hydrogen passivation.

Traditionally, the passivation is accomplished during the deposition of a $SiN_4$ layer as an antireflection coating on top of the semiconductor surface near the junction after diffusion. A $SiN_4$ layer may be deposited from $SiH_4$ and $NH_4$ gas in a CVD process. The excess hydrogen is diffused into the material during the deposition of the $SiN_4$ layer thus satisfying dangling bonds, thereby improving the carrier lifetime and improving cell efficiency.

In contrast to the known prior art, the disclosed RTA method, preferably, but not necessarily, includes hydrogen passivation of step 18 performed during laser diffusion as long as an excess of hydrogen is present in the region of the laser molten Si. In particular, a passivation agent—hydrogen—is introduced with the carrier gas in step 16. Alternatively, the hydrogen may be derived as a result of the decomposition of hydrogen containing compounds that are part of a compound constituting the dopant source.

The introduction of the hydrogen in step 18 during diffusion step 16 has an important consequence constituting a further feature of the disclosure. It is no longer required that passivation be performed during the anti-reflection coating process step as typically accomplished in the known prior art. This provides for the opportunity of utilizing other compounds to form anti-reflection coatings. For example, titanium-dioxide that can be deposited on the surface as an anti-reflection coating offers better performance than the conventional silicon-nitride coating, but is generally not used since the deposition process for this material excludes hydrogen passivation as part of the deposition process.

The formation of the anti-reflection coating in step 24, however, represents still a further important feature of the disclosure. In particular, as the beam scans across the Si surface, the gases introduced into the chamber during step 16 may include, in addition to inert gases and hydrogen, nitrogen ($N_2$) and/or ammonia ($NH_4$). Recalling that elevated temperatures within the chamber are responsible for partial vaporization of dopants as well as Si, the vaporized species tend to drop back on the surface behind the trailing edge of the scanning beam due to somewhat cooler ambient conditions. While some of the dropped dopants again diffuse into the melting Si surface, others undergo a complex chemical reaction with nitride or ammonia forming a condensed silicon nitride layer. Under the right circumstances, the layer covering the entire surface at the completion of the scanning turns blue which represents the desired anti-reflection coating. Accordingly, the disclosed process presents a possibility of forming the AR coating during diffusion step 16.

The process 10 is also characterized by providing the texturing of the surface simultaneously with deposition step 18. The texturing step may be realized by either beam pulsing or modulation (pulsed lasers) or scanning method (CW operated lasers). In contrast to chemical etching using certain acid chemistries to texture the surface of mono- or poly-crystalline silicon wafers to generate surface features that form light traps, and therefore improve solar cell efficiency, the disclosed method incorporates the laser energy during the diffusion process for surface texturing.

A further aspect of the disclosure provides for laser diffusion of selected areas of a solar cell where the front contacts are formed at a later step in the manufacturing process as may be desired for special structures of solar cells referred to as "Laser Grooved, Buried Contact Cells" (BCSC). The laser grooving step can be performed by strategic local and partial exposure of the wafer already processed by the above-disclosed method of laser diffusion so that a uniform junction has already been formed on the front side of the wafer. A second diffusion step similar to the above-discussed one forms deeper and higher doped local junctions where the front contacts are subsequently fabricated by any suitable form of metal deposition of the highly doped and deep junction regions such as electroplating or screen printing.

Figure 2:
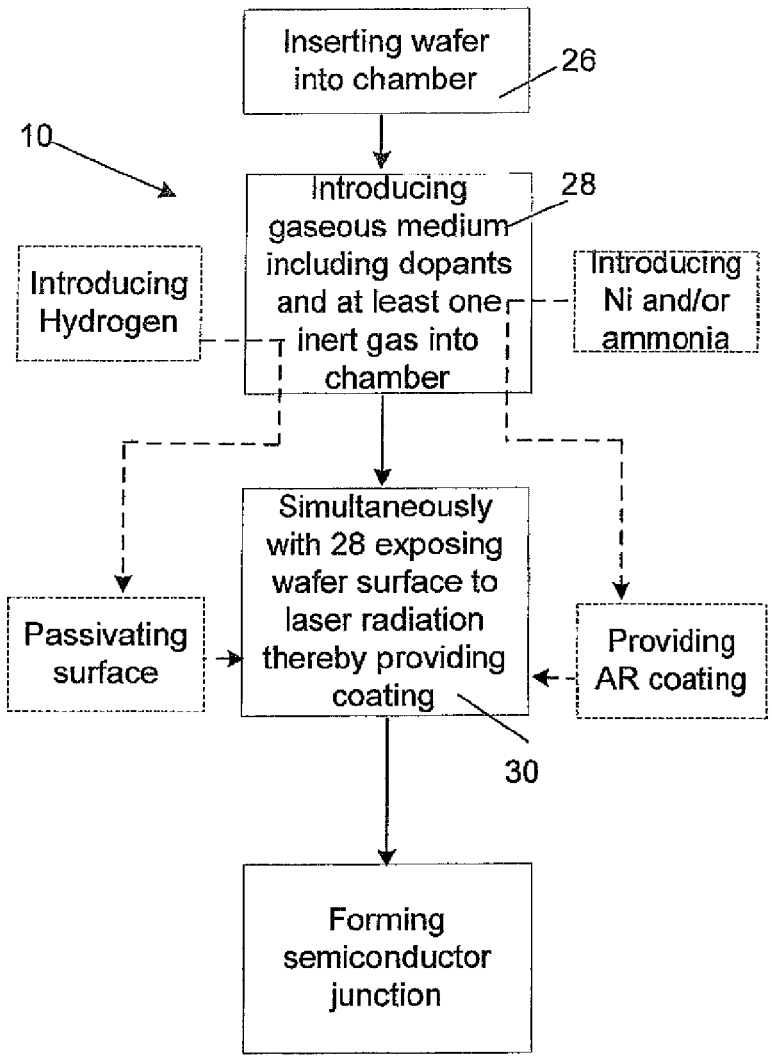
FIG. 2 illustrates another embodiment of the disclosed method.

FIG. 2 illustrates a further embodiment of the disclosed method and relates to the improved GILD surface. Having many similarities with the above disclosed LIMPID based process, the GILD-based embodiment of the disclosed process begins with the introduction of a Si wafer into a vacuum chamber in step 26. Once the desired ambient conditions are established in step 28, a gaseous medium, including at least inert gases along with optional, at this stage of the process, hydrogen, nitrogen and/or ammonia, and, if course, dopant gas such $H_3PO_4$ or $POCl_3$ is introduced into the chamber. Further, the gaseous medium is exposed to a laser beam in step 28 which includes steps similar to those disclosed in the LIMPID-based process.

Figure 3:
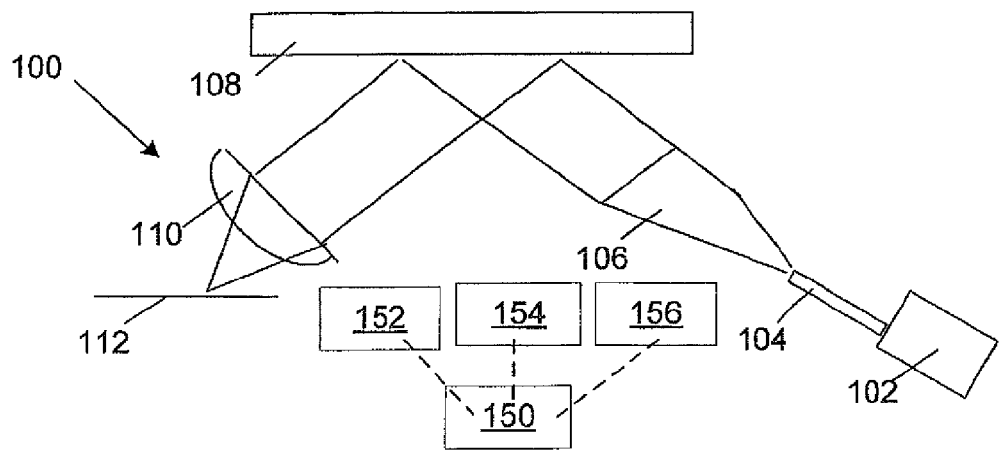
FIG. 3 is a layout of a wafer scanning arrangement.

Turning to FIG. 3, an apparatus 100 may be configured to realize both the disclosed method based on both LIMPID and GILD techniques. For example, the output of a high power diode pumped ytterbium fiber laser 102 operating in the CW mode is homogenized and focused into a line shaped laser beam. The apparatus 100 further includes a laser output collimator 104, beam expander 106, mirror 108, and cylinder lens 110. The laser beam is scanned across a Si wafer 112 that is coated with a suitable material containing the desired doping atoms under the filled with inert gases ambient as well with or without compounds containing significant concentrations of hydrogen, nitrogen and/or ammonia. In case of a pulsed-operated laser, dopant gases are introduced along with the gaseous medium by means 152. To provide simultaneous delivery of dopant atoms, inert gases and optionally passivating species, such as hydrogen, apparatus 100 includes a controller 150 executing software capable of actuating gas-delivering unit 152, dopant delivering unit 154 and passivating species delivery unit 156 substantially simultaneously so as to provide for minimizing the formation of surface oxidation.

Scanning can be performed by mechanical means where the wafer is mounted on a single axis motion table having velocity control of ±1%. Alternatively the beam can be scanned by mechanical motion of the beam shaping optics as shown in FIG. 4.

Figure 3A:
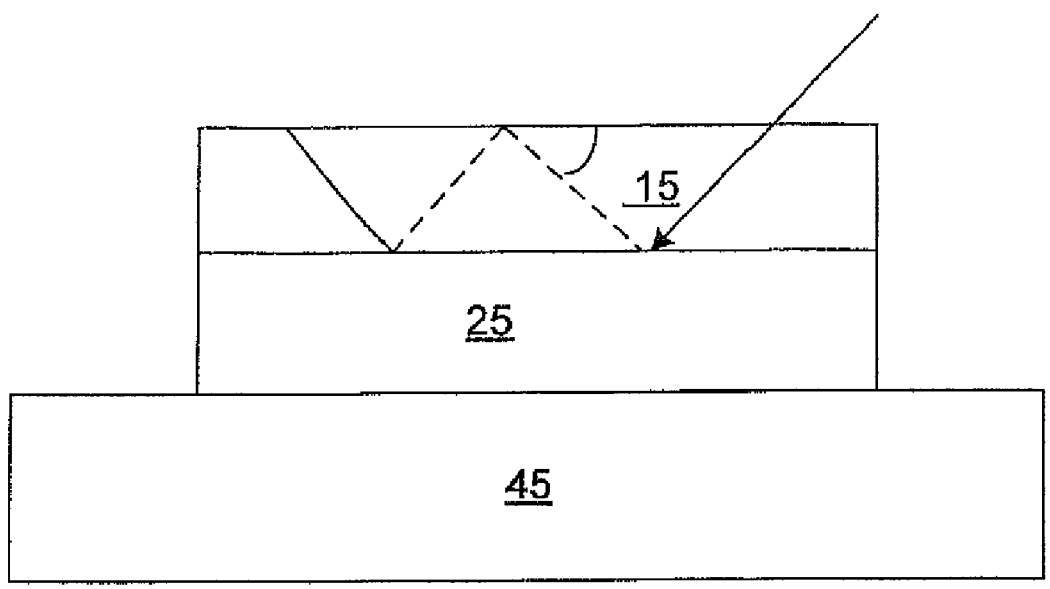
FIGS. 3A and 3B are respective schematic views illustrating respective embodiments of the scanning arrangement configured to provide the total internal reflection of the incident beam within the film.
Figure 3B:
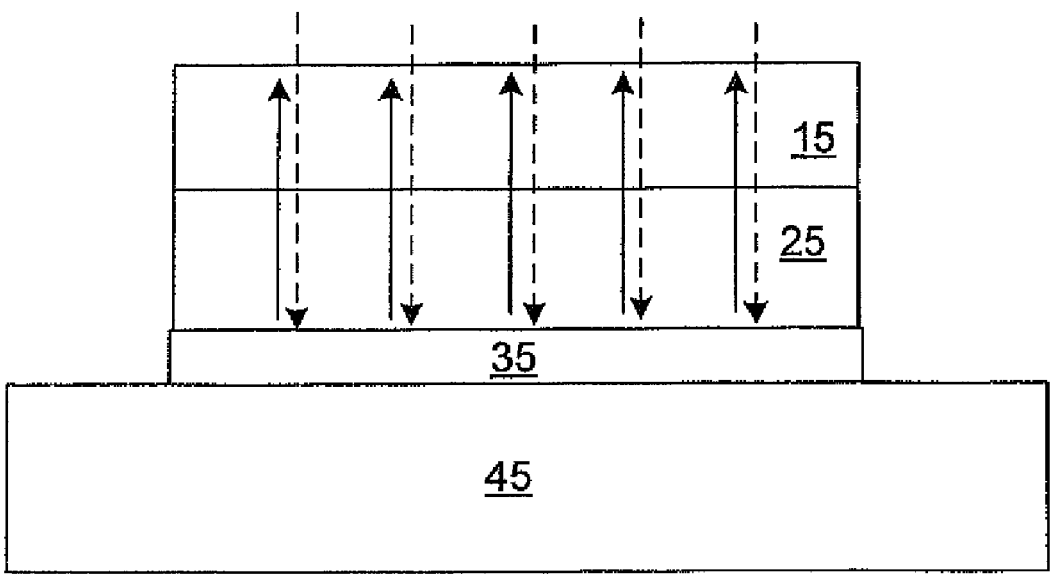

In accordance with a further feature of the disclosure, process 10 may be intensified by trapping a laser beam within the molten Si surface as discussed in detail in reference to FIGS. 3A and 3B. The trapping of light radiation is associated with a total reflection of radiation within the molten surface and, thus, preservation of heat generated by the irradiation.

As shown in FIG. 3A, the angle of the beam incidence is set to at most or less than 43 degrees with respect to wafer surface 25. Such an angle ensures that the laser beam has a minimum of reflection from a film 15 due to total internal reflection therein since the angle of incidence is less than the Brewster angle.

FIG. 3B illustrates an alternative embodiment of apparatus 100 also configured to provide a minimum of reflection from the surface due to total internal reflection in the dopant film. As practice shows, some of the laser energy during diffusion, for example, at the preferred wavelength of 1.06 µm is not effectively utilized. This underutilized energy may be recovered by positioning an efficient reflector 35, such as an IR reflecting gold coating, behind the wafer atop support 45. In contrast to the embodiment of FIG. 3A, thus, the laser beam of FIG. 3B may be incident upon Si surface 15 at a right angle.

The laser beam may also be modulated so that laser light pulses are obtained. A single mode or multi-mode ytterbium fiber laser, operating in the infrared spectrum at a wavelength of 1.06 µm. as, for example, YLR-1000-SM fiber laser designed and manufactured by IPG Photonics of Oxford, Mass. Alternatively a direct diode laser light source such as the model DLR-1000 available from IPG Photonics of Oxford, Mass. may be used. The output wavelength of the direct diode laser system is 980 nm. The preferred output beam characteristics are "top hat" and square available commercially.

Figure 4A:
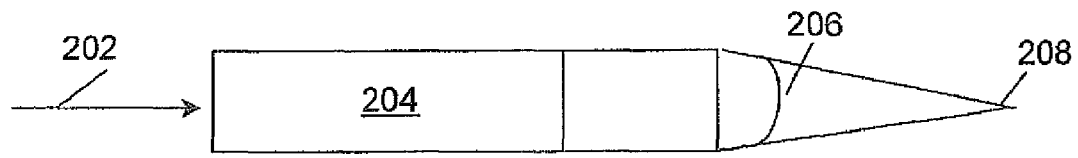
FIGS. 4A, 4B and 4C are respective elevation side, plan and orthogonal views of an optical schematic for forming a line shaped laser beam.
Figure 4B:
Figure 4C:
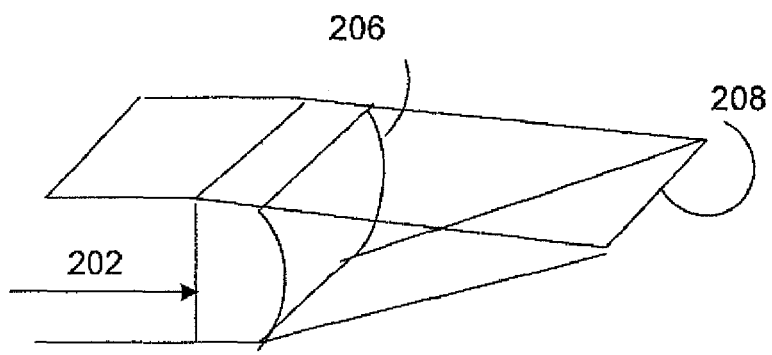

The apparatus used for beam shaping optics is shown in FIGS. 4A, 4B, and 4C. FIG. 4A is the side elevation view of the apparatus of FIG. 3, FIG. 4B is the plan view thereof and FIG. 4C is the orthogonal view of the apparatus of FIG. 3. The apparatus takes a laser beam 202 that enters a beam-expanding telescope ("BET") 204. Then the beam passes through a cylinder lens 206 that focuses the beam into a line beam 208.

The output beam from the laser is expanded to cover the entire width of the Si wafer 112 (current standard is 153 mm). The beam is then focused by a single cylinder lens 110 to form a long narrow beam. Alternatively a diffractive optical element may be used to form a laser beam of similar characteristics. The beam is scanned over the wafer as shown schematically in FIG. 3. The scanning speed is adjusted such that the Si surface covered by a thin dopant film is melted to result in the desired junction characteristics in terms of junction depth and dopant concentration. The preferred junction depth ranges between 1,000-3,000 Å or less and the preferred sheet resistivity is between 35 and 100 ohms per square.

The following briefly summarizes some of the advantages of the present process distinguishing the latter over the known prior art and including, among others, the following:
1. The introduction of a gaseous medium containing inert gases and $N_2$ during a deposition step
2. The passivation of the Si surface by hydrogen either introduced along with the gaseous medium or derived from doping compound on the surface.
3. The use of dopant containing medium such as $H_3PO_4$ or $POCl_3$.
4. The total internal reflection of a laser beam within the dopant surface coating.
5. Texturing and junction depth as a consequence of beam pulsing or modulation or scanning method.
5. The use of CW-operated lasers and a wideband of frequencies.

Although the preferred embodiments of the present invention have been described herein, the above description is merely illustrative. Further modification of the invention herein disclosed will occur to those skilled in the respective arts and all such modifications are deemed to be within the scope of the invention as defined by the appended claims.

What is claimed is:

1. The process for fabricating a semiconductor junction in a Si wafer, comprising
thermally treating a surface of the Si wafer by a laser beam in a processing chamber so as to melt the surface to a desired depth in the presence of dopant atoms, thereby driving at least a part of the dopant atoms into the melting surface to form a film, wherein the thermal treatment is selected from the group consisting of annealing and diffusion and a combination of these; and
simultaneously with the surface irradiation, introducing a gaseous medium including at least one inert gas into the processing chamber, thereby controlling formation of a $SiO_2$ layer atop the surface.

2. The process of claim 1, wherein the thermal treatment of the wafer surface includes totally reflecting the laser beam within the melting surface, wherein the total reflection includes directing the laser beam at an angle smaller than a Brewster's angle.

3. The process of claim 1, wherein the total reflection of the laser beam includes directing the laser beam substantially normally to the surface, and disposing a light reflector under the wafer.

4. The process of claim 1 further comprising passivating the melting surface of the wafer, thereby minimizing dangling bonds formations.

5. The process of claim 4 wherein the surface passivation includes introducing hydrogen simultaneously with the gaseous medium.

6. The process of claim 4, wherein the surface passivation includes chemically bonding hydrogen or hydrogen-containing additive to the dopant atoms of the film and disposing the film upon the Si surface before the irradiation of the surface.

7. The process of claim 6, wherein the hydrogen or hydrogen containing additive is admixed with a solution containing the dopant atoms, the dopant atoms being selected from the group consisting of P, B, As, and Sb and a combination of these.

8. The process of claim 1, wherein the introduction of the gaseous medium occurs at about an atmospheric pressure.

9. The process of claim 1, wherein the gaseous medium is introduced at a pressure below or above an ambient pressure.

10. The process of claim 1 further comprising:
introducing nitrogen or ammonia simultaneously with the introduction of the gaseous medium, and providing a chemical reaction between the introduced nitrogen or ammonia and Si disposed upon the melting surface, thereby providing an antireflection coating of a portion of the melting surface upstream from the laser beam while continuing the irradiation of a remaining portion of the surface.

11. The process of claim 1 further comprising texturing the surface simultaneously with the irradiation, thereby utilizing an energy of the laser beam.

12. The process of claim 1 further comprising a subsequent irradiating step of selected areas of the wafer surface, thereby forming highly doped regions to facilitate the formation of front contacts.

13. The process of claim 1, wherein the irradiation of the surface includes
providing a pulsed laser beam, and
monitoring at least one parameter selected from the group consisting of laser irradiation intensity, pulse duration, wavelength and a combination of these.

14. The process of claim 1, wherein the irradiation of the surfaces includes scanning the laser beam radiated by a SW-operated laser while monitoring a parameter selected from the group consisting of a beam scanning rate, beam intensity, diffusion rate, and wavelength and a combination thereof.

15. The process of claim 1, wherein the gaseous medium contains a gas selected from the group containing $H_3PO_4$ and $POCl_3$.

16. An apparatus for fabricating a semiconductor junction in a Si wafer:
a laser source radiating an output beam towards the wafer so as to melt a surface thereof,
a dopant delivery unit configured to deliver dopant species toward the surface;
a gas delivery unit configured to deliver a gaseous medium containing at least one inert gas and hydrogen toward the surface;
a controller coupled to the gas and dopant delivery units and executing a software providing the delivery of the gaseous medium simultaneously with a diffusion of the dopant species into the molten surface so as minimize oxidation of the molten surface during the laser irradiation; and
a laser actuating unit coupled to the controller and operative to angularly displace the laser source relative to the surface in response to a signal from the controller so as to thermally treat the surface, wherein the thermal treatment is selected from the group consisting of annealing and diffusion and a combination thereof.

17. The apparatus of claim 16 further comprising a beam guide unit operative to guide the beam towards the surface of the wafer, the guide unit having a beam expanding telescope and a light focusing bulk optics cylinder configured to shape the output beam into a narrow elongated beam, wherein the laser source is selected from the group consisting of a fiber CW-operated laser, pulsed-operated fiber laser and $CO_2$ laser and radiate-s a wavelength ranging between about 193 nm and about 10600 nm.

18. The apparatus of claim 17 further comprising a beam-scanning unit coupled to the controller and the CW-operated laser and operative to scan the surface of the wafer at a predetermined rate.

19. An apparatus for fabricating a semiconductor junction in a Si wafer:
a laser source radiating an output beam towards the wafer so as to melt a surface thereof,
a dopant delivery unit configured to deliver dopant species toward the surface;
a gas delivery unit configured to deliver a gaseous medium containing at least one inert gas and hydrogen toward the surface;
a controller coupled to the gas and dopant delivery units and executing a software providing the delivery of the gaseous medium simultaneously with a diffusion of the dopant species into the molten surface so as minimize oxidation of the molten surface during the laser irradiation; and
a laser actuating unit coupled to the controller and operative to angularly displace the laser source relative to the surface in response to a signal from the controller so as to thermally treat the surface, wherein the thermal treatment is selected from the group consisting of annealing and diffusion and a combination thereof, the angle being selected so as to provided total internal reflection of the beam within the molten surface; and
a light reflective component displaced below and in contact with the wafer and capable of providing the total internal reflection of the beam directed substantially perpendicular to the molten surface.

* * * * *